(12) United States Patent
Chamberlin et al.

(10) Patent No.: US 10,172,243 B2
(45) Date of Patent: Jan. 1, 2019

(54) PRINTED CIRCUIT BOARD AND METHODS TO ENHANCE RELIABILITY

(71) Applicant: International Business Machines Corporation, Armonk, NY (US)

(72) Inventors: Bruce J. Chamberlin, Vestal, NY (US); Scott B. King, Rochester, NY (US); Joseph Kuczynski, North Port, FL (US); David J. Russell, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 15/351,066

(22) Filed: Nov. 14, 2016

(65) Prior Publication Data

US 2018/0139852 A1    May 17, 2018

(51) Int. Cl.
  *H05K 3/00*  (2006.01)
  *H05K 3/40*  (2006.01)
  *H05K 3/22*  (2006.01)
  *H05K 3/46*  (2006.01)
  *H05K 1/11*  (2006.01)
  *H05K 1/09*  (2006.01)

(52) U.S. Cl.
  CPC ............. *H05K 3/4076* (2013.01); *H05K 1/09* (2013.01); *H05K 1/116* (2013.01); *H05K 3/22* (2013.01); *H05K 3/4644* (2013.01); *H05K 2201/095* (2013.01); *H05K 2201/09372* (2013.01); *H05K 2203/10* (2013.01); *H05K 2203/11* (2013.01)

(58) Field of Classification Search
  CPC .... H05K 3/0017; H05K 3/002; H05K 3/0023; H05K 3/0046; H05K 3/0026; H05K 3/0041; H05K 3/0029; H05K 3/0032; H05K 3/0035; H05K 3/0038
  See application file for complete search history.

(56) References Cited

U.S. PATENT DOCUMENTS

| | | | |
|---|---|---|---|
| 4,254,172 | A | 3/1981 | Takahashi et al. |
| 6,090,474 | A | 7/2000 | Johansson et al. |
| 6,427,325 | B1 | 8/2002 | Johansson et al. |
| 6,794,040 | B2 | 9/2004 | Johansson et al. |
| 7,615,705 | B2 | 11/2009 | Chamberlin et al. |
| 8,957,321 | B2 | 2/2015 | Harazono et al. |
| 8,974,888 | B2 | 3/2015 | Balcome et al. |

(Continued)

FOREIGN PATENT DOCUMENTS

| | | |
|---|---|---|
| CN | 104244614 A | 12/2014 |
| GB | 2295114 A | 5/1996 |
| KR | 101418036 B1 | 7/2014 |

*Primary Examiner* — Jeremy C Norris
(74) *Attorney, Agent, or Firm* — Patterson + Sheridan, LLP

(57) ABSTRACT

In some embodiments, methods include drilling one or a plurality of PTHs with any industrial grade drill to fabricate holes with positive etch back, flooding the PTHs with a dilute solution of an acrylate monomer/oligomer containing an appropriate level of peroxide initiator, polymerizing the acrylate, and then rising the PTHs with the solvent used in the formulation of the acrylate material. In one embodiment, the printed circuit board may include a substrate comprising a plurality of metal layers separated by a plurality of insulating layers; a plurality of plated through holes formed in the substrate, each plated through hole comprising: recesses formed at each insulating layer, copper lands between the recesses, a polymer coating in each recess, and a metal layer lining the plated through hole.

12 Claims, 4 Drawing Sheets

(56) References Cited

U.S. PATENT DOCUMENTS

| | | |
|---|---|---|
| 9,179,556 B2 | 11/2015 | Kuczynski et al. |
| 2010/0193229 A1 | 8/2010 | Zhang |
| 2014/0190733 A1 | 7/2014 | Dudnikov, Jr. et al. |

PRINTED CIRCUIT BOARD AND METHODS TO ENHANCE RELIABILITY

FIELD

The present disclosure generally relates to methods to enhance printed circuit board reliability with high aspect ratio plated through holes and a printed circuit board which embodies the method application.

BACKGROUND

In the fabrication of a printed circuit board (PCB) it is desirable to provide electrical connection of circuits at various layers within the PCB. This is typically done using a plated through hole (PTH). A PTH is typically formed using the steps of drilling, desmearing, and plating. The hole quality before plating has an impact on the robustness of the finished PTH, particularly its ability to withstand thermal cycling, such as through multiple high temperature solder reflows, without fatiguing to the point of failure.

A PCB is normally made of layers of conductive and dielectric material. The conductive material is typically metal, such as copper, and the dielectric material is typically an organic polymer. The layers may be adhered using a bonding agent, typically a prepreg sheet adhesive. In forming the PTH, holes are drilled through the conductive material and the dielectric material using a mechanical drill bit, or in some cases a laser. There are several variables in the drilling process which can affect the hole roughness. The drill bit design, the drill bit sharpness, the insulating dielectric material being drilled in the PCB insulating layers, the rotation of the drill bit (speed) and the rate at which the drill bit is forced down through the PCB (feed) all can play a role in the hole roughness.

When drilling the holes using a drill bit, heat from friction commonly causes organic materials from the insulating material and the bonding agents to coat the inner hole surface, at least partially coating exposed surfaces of the conductive material. The coating is removed prior to plating to provide an electrical connection between the plating material and the conductive material of the PCB. A desmear process is used after drilling the hole to remove the polymer coating. A typical desmear process consists of swelling the resin with an organic solvent, etching the resin with a hot alkaline potassium permanganate solution, and neutralizing the alkaline permanganate with an acid such as sulfuric acid. Various parameters such as swelling and etching time and temperature and permanganate concentration can affect the dielectric etching. If the etching is not aggressive enough, smear will remain on the inner hole surface and can result in a poor electrical and mechanical connection when the PTH is plated. If the etch is too aggressive, the dielectric layers can be etched excessively, resulting in recesses in the hole surface between the conductive layers, leading to excessive hole roughness that can cause defects.

Following desmear, the PTH is plated, typically with copper. A variety of plating processes can be used, such as full panel plate or pattern plate. A typical plating process involves applying a seed layer in the hole, such as colloidal palladium. An electroless copper bath is used to deposit a layer of copper thick enough to carry some current, then the PCB is plated in an electrolytic copper bath. Since the plating follows the topography of the PTH sidewall, the roughness of the copper plating is influenced by the roughness of the sidewall prior to plating.

The PTH reliability is strongly influenced by the sidewall roughness, and to minimize roughness the drill, desmear, and plating operations are commonly co-optimized to achieve the best results. Standard practice is to experimentally vary the drill, desmear, and plate parameters to find an optimum combination for a particular PCB design.

With the challenges described above, forming reliable PTHs in high aspect ratio PCBs is generally difficult. The PCBs can be from 3 mm to 10 mm thick, with typical aspect ratios ranging from 10:1 up to 15:1 for thicker panels. As demand for device density on PCBs increases, the PCB industry is gradually decreasing via wall-to-wall distances between PTHs and size of PTHs. This trend increases the likelihood of conductive anodic filament (CAF) formation, which is a failure mode characterized by formation of copper filaments in the PCB between adjacent conductive layers or PTHs leading to short circuits in the PCB. Therefore, there is a need to improve PCB reliability by mitigating the likelihood of CAF formation within the PCB multilayer structure.

There is also a need in the art to mitigate PTH wall roughness, which is a known contributor to PTH failures. Rough side walls may result in degraded laminate integrity leading to insulation resistance failures in the dielectric and/or barrel cracks in the PTH plating. Hole wall roughness is known to cause stress risers to grow in the copper plating, leading to reduced connectivity and laminate adhesion in the PCB and the PTH.

SUMMARY

Methods disclosed herein include forming a plurality of through holes in a substrate, the substrate comprising a plurality of metal layers separated by a plurality of insulating layers; selectively etching the insulating layers in the through holes to form a plurality of copper lands and recesses between the copper lands; exposing the substrate to a polymerization precursor mixture comprising an initiator and a monomer or oligomer whose polymerization is inhibited by copper to form a precursor layer in the recesses of the through holes; polymerizing the precursor layer to form a polymer coating in the recesses of the through holes; and washing the through holes with an organic solvent.

Also disclosed herein are printed circuit boards that have a substrate comprising a plurality of metal layers separated by a plurality of insulating layers; a plurality of plated through holes formed in the substrate, each plated through hole comprising: recesses formed at each insulating layer; copper lands between the recesses which protrude into the plated through holes; a polymer coating in each recess; and a metal layer lining the plated through hole.

BRIEF DESCRIPTION OF THE DRAWINGS

So that the manner in which the above recited features of the present disclosure can be understood in detail, a more particular description of the present disclosure, briefly summarized above, may be had by reference to embodiments, some of which are illustrated in the appended drawings. It is to be noted, however, that the appended drawings illustrate only typical embodiments of the present disclosure and are therefore not to be considered limiting of its scope, for the present disclosure may admit to other equally effective embodiments.

DETAILED DESCRIPTION

Methods described herein use a polymer coating applied in a plated through hole between the conductive surfaces in the plated through hole to reduce hole wall roughness following etching of the dielectric materials exposed at the hole wall. Two types of etching are generally employed to prepare PTHs for plating, "positive etch back" and "negative etch back." Negative etch back is a mild etching process that reduces protrusion of the dielectric materials in the through hole such that the surface of the through hole is maximally smooth. Sometimes, however, negative etch back does not completely remove organic material from the conductive surfaces. Positive etch back, where the dielectric materials are aggressively etched beyond the conductive surfaces, so that recesses are formed between the conductive surfaces, and conductive lands protrude into the through hole between the recesses, is used to completely remove organic material from the conductive surfaces. Positive etch back, however, leads to hole roughness. The methods described herein, and the PCBs resulting from those methods, employ a polymer coating applied in the recesses between the conductive lands to minimize hole roughness following positive etch back. The polymer coating is derived from a polymerization process that is inhibited by the metal of the conductive surfaces such that polymer does not form on the metal surfaces.

Figure 1:
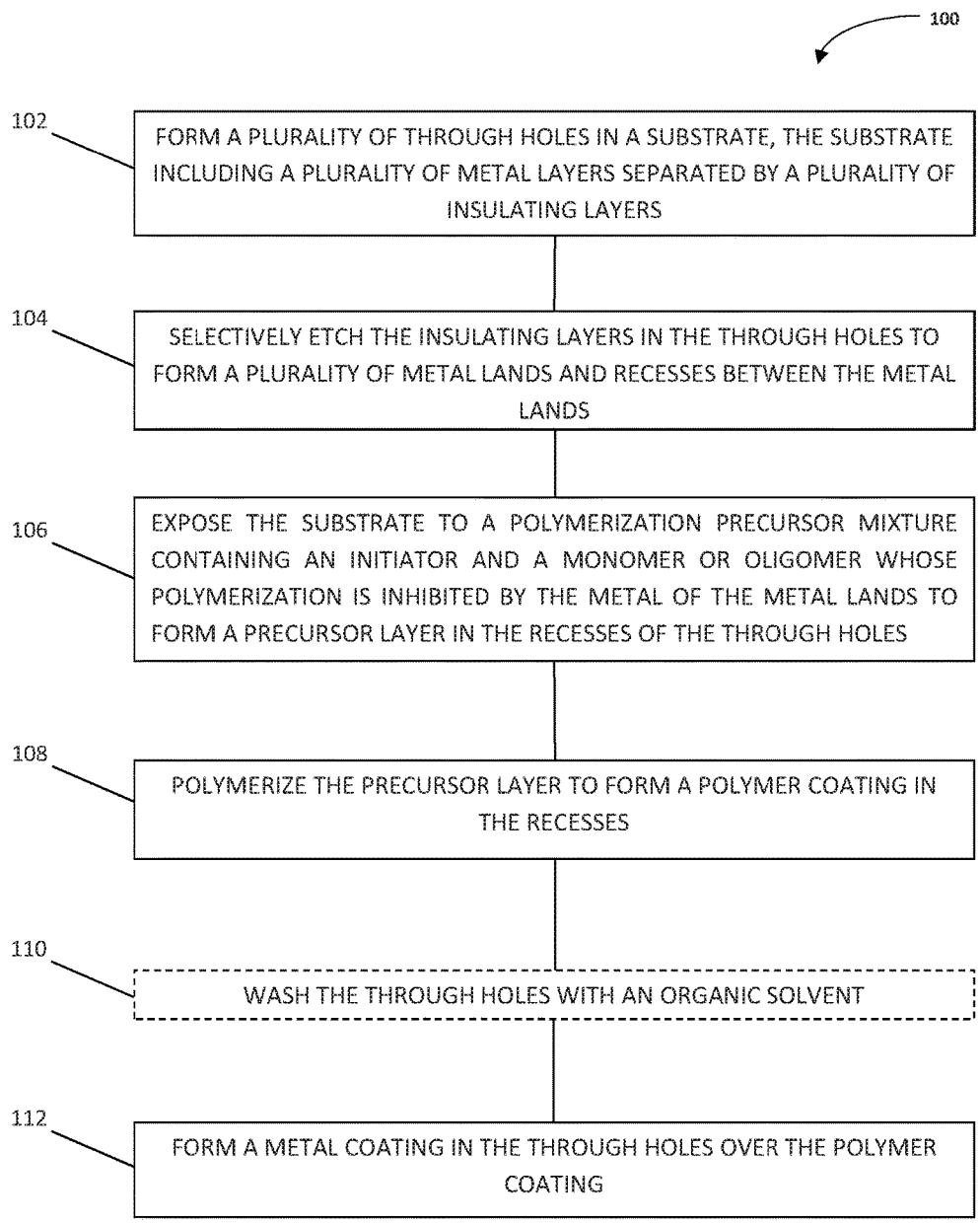
FIG. 1 is an operation diagram illustrating a method of forming a plated through hole according to one embodiment.

FIG. 1 is an operation diagram illustrating a method 100 according to one embodiment. At 102, a plurality of through holes is formed in a substrate with a plurality of metal layers separated by a plurality of insulating layers. Copper is commonly used for the metal layers, although any metal that can be used for electrical connections may be used in the substrate, which is typically a PCB. The insulating layers are typically made of an organic polymer material, such as epoxy, polyimide, polyphenylene oxide, phenolic formaldehyde resins, or mixtures or combinations thereof, which may include fiber or paper components, for example fiberglass. The metal and insulating layers typically have thickness from about 0.1 mm to about 0.5 mm each, and may vary in thickness. The through holes are typically formed by mechanical drilling or laser drilling, and the holes formed may have aspect ratio (ratio of depth to width) of 10:1 or more, commonly 15:1 or more.

Figure 2A:
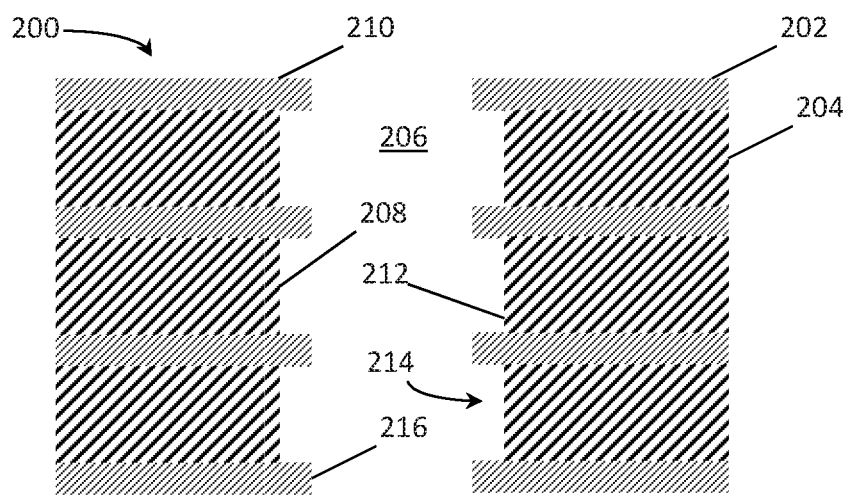
FIGS. 2A-2C are schematic cross-sectional views of a PCB at different stages of the method of FIG. 1.

At 104, the insulating layers exposed at the inner surfaces of the through holes are selectively etched to form a plurality of metal lands separated by a plurality of recesses between the metal lands. FIG. 2A is a schematic cross-sectional view of a PCB 200 after operation 104. The PCB 200 is an example of the substrate referred to in the description of the method 100 of FIG. 1. The PCB has a plurality of metal layers 202, which may be copper, separated by a plurality of insulating layers 204, which may be a polymer material, optionally impregnated with a fiber material. The insulating layers 204 may be fiberglass impregnated, or glass impregnated, polyamide in some cases. The metal layers 202 and the insulating layers 204 are commonly adhered together using a prepreg sheet adhesive.

A through hole 206, formed as described herein, is shown in the PCB 200 of FIG. 2A. The through hole 206 features inner walls 208 made rough by the drilling process of 102 and the etching process of 104. The inner walls 208 feature areas of exposed metal 210 and areas of exposed insulating material 212. The areas of exposed metal 210 are free of any organic material covering the surfaces protruding into the through hole 206 by virtue of the etching performed at 104. The areas of exposed insulating material 212 are recessed laterally along the plane defined by the PCB 200, and the layers thereof, such that a plurality of recesses 214 are formed between the protruding metal portions, which form metal lands 216.

The etching process of 104 is typically performed with an etchant selective for the insulating material. In many cases, a solution of hot alkaline potassium permanganate solution is used. The recesses 216 may be formed to a lateral extent of 0.1 μm to 20 μm, such as between 0.5 μm and 5 μm, and may vary in lateral extent. The etching solution is typically neutralized then rinsed away using water, and the substrate dried. The substrate may then be inspected to determine whether the drilling operation 102 and the etching operation 104 have had the desired effect of, for example, providing metal lands free of organic coating separated by recesses in the through holes. Conductivity of the metal lands in the through holes may be tested, for example, to detect any remaining polymer covering the metal lands.

At 106 (FIG. 1), the substrate is exposed to a polymerization mixture containing one or more initiators and one or more monomers or oligomers that polymerize by effect of the initiator, but whose polymerization is inhibited by the metal of the exposed metal lands. A layer of the precursor mixture is formed in the through holes along the internal walls 208 (FIG. 2A) thereof, and particularly in the recesses 214. The precursor mixture may fill the through holes or coat the internal walls, and may cover the exposed surfaces of the metal lands 216 as well as the exposed surfaces of the insulating material in the recesses 214. Alternately, the precursor mixture may coat the holes to a thickness of 0.1 μm to 10 μm.

The monomer or oligomer may be a vinyl-containing material such as a vinyl monomer or a vinyl oligomer where the vinyl functionality polymerizes in the presence of the initiator, but the polymerization is inhibited by the metal of the metal lands. Examples of such vinyl materials include olefins; acrylates; methacrylates; N-vinyl compounds such as N-vinyl-pyrrolidone, N-vinyl-caprolactam, and N-vinyl-imidazole; and O-vinyl compounds such as alkyl vinyl ethers, examples of which include ethyl, n-butyl, isobutyl, tert-butyl, cyclohexyl, 2-ethylhexyl, dodecyl, and octadecyl vinyl ether. Examples of acrylate materials that may be used include methacrylate, methyl acrylate, ethyl acrylate; 2-Chloroethyl vinyl ether; 2-ethylhexyl acrylate; hydroxyethyl methacrylate; butyl acrylate; butyl methacrylate; TMPTA (Trimethylolpropane triacrylate). Mixtures of monomers may be used to adjust properties of the polymer eventually formed in the recesses of the through holes.

The initiator may be any polymerization initiator, including cationic, anionic, and radical initiators. Peroxides initiators that may be used include, but are not limited to dilauroyl peroxide, di(4-tert-butylcyclohexyl) peroxydicarbonate, dicetyl peroxydicarbonate, dimyristyl peroxydicarbonate, 2,2'-azodi(isobutyronitrile), 2,2'-azodi(2-methylbutyronitrile), dicumyl peroxide, dibenzoyl peroxide, 2,5-dimethyl-2,5-di(tert-butylperoxy)hexane, tert-butylperoxy 2-ethylhexyl carbonate, tert-amyl peroxy-2-ethylhexanoate, tert-amylperoxy 2-ethylhexyl carbonate, 2,5-dimethyl-2,5-di(2-ethylhexanoylperoxy)hexane, 2,5-dimethyl-2,5-di(tert-butylperoxy)hexyne-3, tert-butyl peroxy-2-ethylhexanoate, 1,1-di(tert-butylperoxy)cyclohexane, tert-butyl peroxyneodecanoate, tert-butyl peroxypivalate, tert-butyl peroxydiethylacetate, 1,1-di(tert-butylperoxy)-3,3,5-trimethylcyclohexane, 3,6,9-triethyl-3,6,9-trimethyl-1,4,7-triperoxonane, di(3,5,5-trimethylhexanoyl) peroxide, 1,1,3,3-tetramethylbutyl peroxy-2-ethylhexanoate, tert-butyl peroxy-3,5,5-trimethylhexanoate, tert-butyl hydroperoxide, di-tert-butyl peroxide, tert-butylperoxy isopropyl carbonate, tert-butyl peroxybenzoate, di(2-ethylhexyl) peroxydicarbonate, tert-butyl peroxyacetate, cumyl hydroperoxide, isopropylcumyl hydroperoxide, tert-butyl cumyl peroxide, tert-amylhydroperoxide, all of which are commercially available.

The polymerization precursor mixture may optionally include other useful materials such as solvents and fillers. Solvents may be used to adjust the thickness of the precursor material layer covering the internal walls 208 (FIG. 2A) of the through holes. Usable solvents include polar and non-polar solvents, which may be organic or partially organic. Hydrocarbons, alcohols, ketones, carboxylic acids, ethers, anhydrides, furans, and the like may be used alone or in mixtures. Exemplary solvents that may be used include hexane, isopropyl alcohol, acetone, methyl-ethyl ketone, tetrahydrofuran, dimethylsulfoxide, dimethylformamide, and N-methylpyrrolidone.

Fillers may be used to adjust the properties of the polymer to be formed eventually in the recesses 214. Fillers may be used, for example, to adjust mechanical properties of the eventual polymer to help absorb mechanical stresses that may otherwise damage. In some cases, it may be useful to form a polymer in the recesses that has a selected coefficient of thermal expansion (CTE), glass transition temperature, modulus, hardness, and/or brittleness. If the polymer has a CTE significantly more or less than the other materials of the PCB, for example, thermal cycling may result in loss of adhesion between the polymer in the recesses and the metal plating of the through holes or the insulating material of the recesses. Selecting a CTE between that of the metal and the insulating material may minimize the changes in relative physical dimensions due to thermal cycling that otherwise might compromise the plated through hole. Likewise, if the polymer has a glass transition temperature that is too low, the polymer may inconveniently soften at elevated temperatures. In some embodiments, the filler may be between 15% and 30% by weight of the unpolymerized mixture, and preferably is between 15% and 20% by weight. Fillers are typically added to the polymerization precursor mixture prior to application to the substrate. Solvents may be used to tune viscosity of the polymerization precursor mixture when fillers are added.

Fused silica is an example of a filler that can be used to adjust properties of the polymer formed in the recesses. Glass impregnated polyamide has a CTE of 9 ppm/K. Copper has a CTE of 16 ppm/K. Acrylate polymers can have CTE of 50-100 ppm/K. Silica has a CTE of 0.55 to 0.75 ppm/K. Thus, adding fused silica as a filler material can lower the overall CTE of the eventual polymer/filler mixture in the recesses, and the CTE of the material can be selected to have a value between that of the insulating material and the metal. Fused silica is a powder that, when mixed into the polymerization precursor mixture, will increase the viscosity of the mixture. Solvents may be used to counteract the viscosity increase, if desired, to improve penetration into the through holes of the substrate. An exemplary mixture for forming the polymer layer is 75 wt % Sartomer 238 (1,6-hexane diacrylate), 24 wt % fused silica, and 1 wt % Sartomer Laurox S (dilauroyl peroxide). Solvent may be added to reduce the viscosity of the mixture to an empirically determined level, if desired.

Figure 2B:
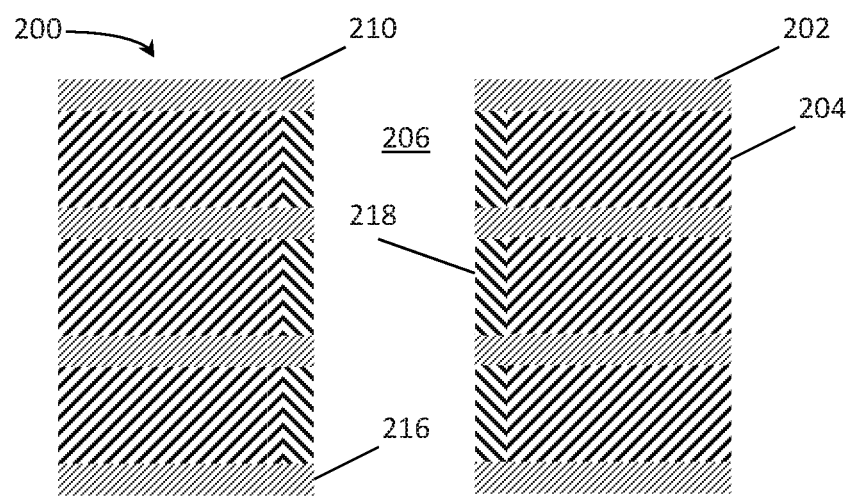

At 108, the precursor layer is polymerized to form a polymer coating or polymer material in the recesses. As noted above, polymerization is inhibited by the metal of the exposed metal surfaces, so little or no polymer forms on the metal lands. FIG. 2B is a schematic cross-sectional view of the PCB 200 after the operation 108 is performed, showing the polymer coating 218. The precursor layer is exposed to energy to perform the polymerization. The energy may be any energy applicable to activate the polymerization reaction. Typically, thermal energy or radiant energy such as UV radiation is used. In one embodiment, the substrate is disposed in an oven and subjected to a temperature of about 40° C. to about 100° C. for at least 10 minutes to activate the polymerization reaction. In another embodiment, the precursor layer is irradiated with UV radiation of wavelength 100 nm to 400 nm, such as 250 nm to 350 nm, for example about 280 nm. The entire substrate may be irradiated using non-directional UV radiation, for example emitted by one or more UV lamps. Alternately, UV radiation may be directed into the through holes using directed radiation such as UV laser radiation. The substrate may be dried prior to polymerization to remove excess solvent. Drying may be accomplished by any convenient means, such as disposing the substrate in a dry atmosphere, exposing the substrate to vacuum, and the like. The polymerization reaction forms a polymer layer having a thickness of about 0.01 µm to 10 µm.

The polymer coating 218 is shown in FIG. 2B having a depth similar to that of the recesses 214. In alternate embodiment, the polymer coating may have a depth more or less than the depth of the recesses. If the depth of the polymer coating is different from the depth of the recesses by too much, roughness of the internal wall 208 is increased. The depth of the polymer coating is typically within about 1 µm of the depth of the recesses.

At 110 (FIG. 1), the through holes are optionally washed with an organic solvent. The depth of the polymer coating may be reduced after the polymer is formed by rinsing the substrate with a solvent effective to dissolve the polymer. Any slight overhang of the polymer coating onto the metal lands resulting from overgrowth of the polymer coating may also be removed by a solvent wash. The solvent wash may be accomplished by immersing the substrate in the solvent or by forcing or flowing solvent through the holes.

Figure 2C:
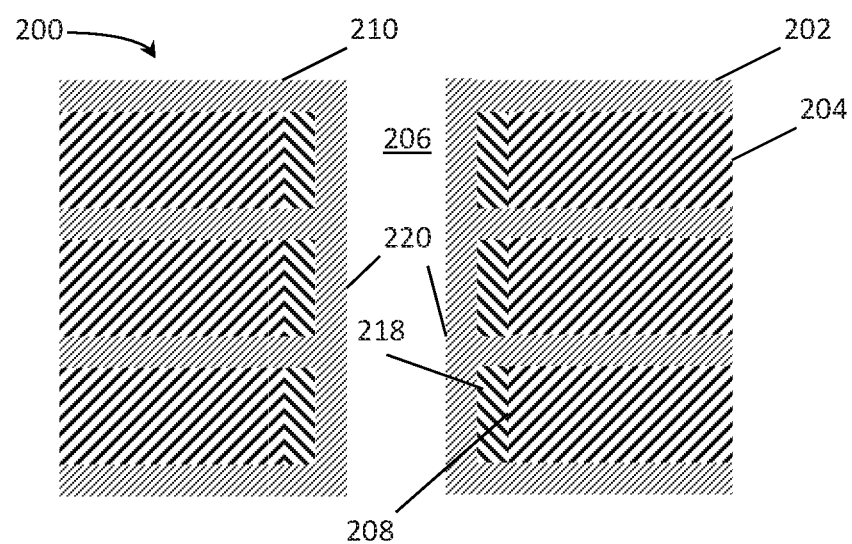

At 112, the through holes are coated with a metal layer to form a PTH. The metal layer on the polymer coating may be formed using an electroplating process The substrate may be immersed in an electrolyte bath and an electric bias applied to deposit the metal layer. A metal seed layer may be formed using an electroless plating process in some embodiments. The seed layer may facilitate the electrochemical deposition process by providing a conductive surface along the entire inner wall of the through holes. Any known electroless metal deposition process may be used to deposit the seed layer, and the metal deposited in the seed layer and the metal layer may be the same metal as in the metal layers of the substrate. FIG. 2C is a schematic cross-sectional view of a PCB subjected to the method 100, at a state following operation 112. A metal coating 220 covers the inner wall 208 of the through hole 206, covering the polymer coating 218. The polymer coating 218 substantially fills the recesses 214 between the insulating layers 204 and the metal coating 220, and between adjacent conductive layers 202. The polymer coating 218 provides capability for physical deformation to absorb stresses that develop in the PCB 200 due to thermal cycling, vibration, and the like, reducing the likelihood of stress cracks and risers in the conductive members of the PCB, and reducing the likelihood of conductive filaments growing through or along the insulating members of the PCB. The plated through holes formed according to the methods described herein typically have $R_a$ roughness less than about 1.4 µm.

While the foregoing is directed to embodiments of the present disclosure, other and further embodiments of the present disclosure may be devised without departing from the basic scope thereof.

We claim:

1. A method, comprising:
forming a plurality of through holes in a substrate, the substrate comprising a plurality of metal layers separated by a plurality of insulating layers;
selectively etching the insulating layers in the through holes to form a plurality of copper lands and recesses between the copper lands;
exposing the substrate to a polymerization precursor mixture comprising an initiator and a monomer or oligomer whose polymerization is inhibited by copper to form a precursor layer in the recesses of the through holes;
polymerizing the precursor layer to form a polymer coating in the recesses of the through holes; and
washing the through holes with an organic solvent.

2. The method of claim 1 wherein the polymerized precursor layer has a thickness of 5 to 10 µm.

3. The method of claim 1 wherein the precursor layer is polymerized by heating in an oven.

4. The method of claim 1 wherein the precursor layer is polymerized by exposure to ultraviolet light.

5. The method of claim 1 wherein the monomer or oligomer is a vinyl containing material.

6. The method of claim 1 wherein the monomer or oligomer is an acrylate.

7. The method of claim 6 wherein the coefficient of thermal expansion of the acrylate is between that of copper and the material comprising the insulating layers and the glass transition temperature of the acrylate is between that of the copper and the material comprising the insulating layers.

8. The method of claim 6 wherein the acrylate has been modified by an inorganic filler.

9. The method of claim 1, further comprising forming a metal layer on the polymer coating to form a plated through hole.

10. The method of claim 7, wherein the forming a metal layer on the polymer coating includes performing an electroplating process.

11. The method of claim 1 wherein the selectively etching the insulating layers in the through holes to form a plurality of copper lands and recesses between the copper lands comprises:
swelling the insulating layers with an organic solvent,
reacting the insulating layers with an inorganic basic solution, and
neutralizing the insulating layers with an acidic solution.

12. The method of claim 1 wherein the copper lands are depressed into the insulating layers.

* * * * *